(12) United States Patent
Kang

(10) Patent No.: US 6,836,439 B1
(45) Date of Patent: Dec. 28, 2004

(54) FERROELECTRIC MEMORY DEVICE COMPRISING REDUNDANCY CIRCUIT

(75) Inventor: Hee Bok Kang, Daejeon (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 0 days.

(21) Appl. No.: 10/608,543

(22) Filed: Jun. 30, 2003

(30) Foreign Application Priority Data

Nov. 8, 2002 (KR) .................................. 10-2002-0069179

(51) Int. Cl.[7] .............................................. G11C 11/22
(52) U.S. Cl. ..................................... 365/200; 365/145
(58) Field of Search ................................ 365/145, 149, 365/200, 230.06

(56) References Cited

U.S. PATENT DOCUMENTS

| | | | |
|---|---|---|---|
| 6,058,053 A | 5/2000 | Tsuji et al. | |
| 6,084,807 A | 7/2000 | Choi | |
| 6,201,744 B1 | 3/2001 | Takahashi | |
| 6,240,007 B1 | 5/2001 | Kang | |
| 6,317,355 B1 | 11/2001 | Kang | |
| 6,377,498 B1 | 4/2002 | Kang | |
| 6,510,071 B2 * | 1/2003 | Oowaki | 365/145 |

* cited by examiner

Primary Examiner—Son Mai
(74) Attorney, Agent, or Firm—Heller Ehrman White and McAuliffe LLP

(57) ABSTRACT

A ferroelectric memory device features a main cell array, a row redundancy cell array, a first column redundancy cell array, a second column redundancy cell array, main bitline pull-up controllers, and column selection controllers. The main cell array includes main bitlines and sub bitlines. The row redundancy cell array is configured to share the main bitlines with the main cell array. The first column redundancy cell array is configured to share wordlines and platelines with the main cell array. The second column redundancy cell array is configured to share redundancy wordlines and redundancy platelines with the row redundancy cell array, and to share redundancy main bitlines with the first column redundancy. The main bitline pull-up controllers pull up main bitlines and redundancy main bitlines in response to first control signals, respectively. The column selection controllers connect data bus lines to the main bitlines and the redundancy main bitlines in response to column selection signals, respectively.

19 Claims, 21 Drawing Sheets

FERROELECTRIC MEMORY DEVICE COMPRISING REDUNDANCY CIRCUIT

BACKGROUND OF THE INVENTION

1. Field of the Invention

The present invention relates to ferroelectric memory devices, and more specifically, to a new structure and a redundancy circuit designed to be suitable for the new cell structure.

2. Description of the Related Art

Generally, a ferroelectric random access memory (hereinafter, referred to as 'FRAM') has attracted considerable attention as next generation memory device because it has a data processing speed as fast as a DRAM (Dynamic Random Access Memory) and conserves data even after the power is turned off.

The FRAM includes capacitors similar to the DRAM, but the capacitors have a ferroelectric substance for utilizing the characteristic of a high residual polarization of the ferroelectric substance in which data is not low even after eliminating an electric field applied thereto.

FIG. 1 is a characteristic curve illustrating a hysteresis loop of a general ferroelectric substance. As shown in FIG. 1, a polarization induced by an electric field does not vanish but keeps some strength ('d' or 'a' state) even after the electric field is cleared due to existence of a residual (or spontaneous) polarization. These 'd' and 'a' states may be assigned to binary values of '1' and '0' for use as a memory cell.

FIG. 2 is a structural diagram illustrating a unit cell of the FRAM device. As shown in FIG. 2, the unit cell of the conventional FRAM is provided with a bitline BL arranged in one direction and a wordline WL arranged in another direction vertical to the bitline BL. A plateline PL is arranged parallel to the wordline and spaced at a predetermined interval. The unit cell is also provided with a transistor T1 having a gate connected to an adjacent wordline WL and a source connected to an adjacent bitline BL, and a ferroelectric capacitor FC1 having the first terminal of the two terminals connected to the drain terminal of the transistor T1 and the second terminal of the two terminals connected to the plateline PL.

FIG. 3a is a timing diagram illustrating a write mode of the conventional FRAM while FIG. 3b is a timing diagram illustrating a read mode of the conventional FRAM.

Referring to FIG. 3a, when a chip enable signal CSBpad applied externally transits from a high to low level and simultaneously a write enable signal WEBpad also transits from a high to low level, the array is enabled to start a write mode. Thereafter, when an address is decoded in a write mode, a pulse applied to a corresponding wordline transits from a "low" to "high" level, thereby selecting the cell.

In order to write a binary logic value "1" in the selected cell, a "high" signal is applied to a bitline BL while a "low" signal is applied to a plateline PL. In order to write a binary logic value "0" in the cell, a "low" signal is applied to a bitline BL while a "high" signal is applied to a plateline PL.

Referring to FIG. 3b, when a chip enable signal CSBpad externally transits from a "high" to "low" level, all bitlines are equalized to a "low" level by an equalization signal before selection of a required wordline.

After each bitline is deactivated, an address is decoded to transit a signal on the required wordline from a "low" to "high" level, thereby selecting a corresponding unit cell. A "high" signal is applied to a plateline of the selected cell to cancel a data Qs corresponding to the logic value "1" stored in the FRAM. If the logic value "0" is stored in the FRAM, a corresponding data Qns will not be destroyed.

The destroyed and non-destroyed data output different values, respectively, according to the above-described hysteresis loop characteristics. As a result, a sense amplifier senses logic values "1" or "0". In other words, as shown in the hysteresis loop of FIG. 1, the state moves from 'd' to 'f' when the data is destroyed while the state moves from 'a' to 'f' when the data is not destroyed.

As a result, the destroyed data amplified by the enabled sense amplifier outputs a logic value "1" while the non-destroyed data amplified by the sense amplifier outputs a logic value "0". The original data is destroyed after the sense amplifier amplifies the data. Accordingly, when a "high" signal is applied to the required wordline, the plateline is disabled from "high" to "low", thereby recovering the original data.

SUMMARY OF THE INVENTION

Accordingly, it is an object of the present invention to provide a ferroelectirc memory device having a bitline structure comprising a main bitline MBL and a sub bitline SBL, wherein the main bitline MBL is connected to a plurality of sub bitlines via switches. Therefore, the driving load of the bitline is reduced to that of one sub bitline SBL, and a driving speed is improved.

It is another object of the present invention to provide a redundancy circuit for the ferroelectric memory device having the above-described structure.

The disclosed ferroelectric memory device comprises a main cell array, a row redundancy cell array, a first column redundancy cell array, a second column redundancy cell array, a main bitline pull-up controller, and a column selection controller.

The main cell array includes a bitline structure comprising a main bitline and a sub bitline. The row redundancy cell array is configured to share the main bitlines with the main cell array. The first column redundancy cell array is configured to share wordlines and platelines with the main cell array. The second column redundancy cell array is. configured to share redundancy wordlines and redundancy platelines with the row redundancy cell array, and to share redundancy main bitlines with the first column redundancy. The main bitline pull-up controller pulls up main bitlines and the redundancy main bitlines in response to first control signals, respectively. The column selection controller connects data bus lines to the main bitlines and the redundancy main bitlines in response to column selection signals, respectively.

DETAILED DESCRIPTION OF THE PREFERRED EMBODIMENTS

The present invention will be described in detail with reference to the accompanied drawings.

Figure 1:
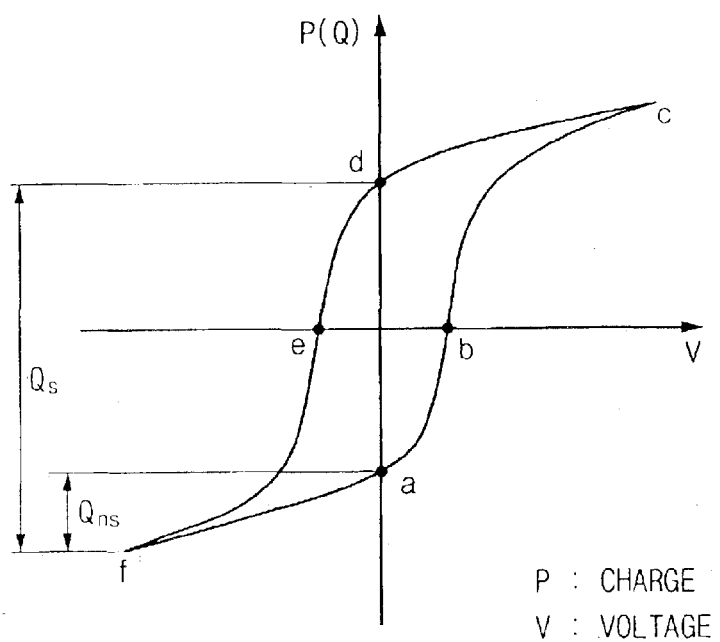
FIG. 1 is a characteristic curve illustrating a hysteresis loop of a general ferroelectric substance.
Figure 2:
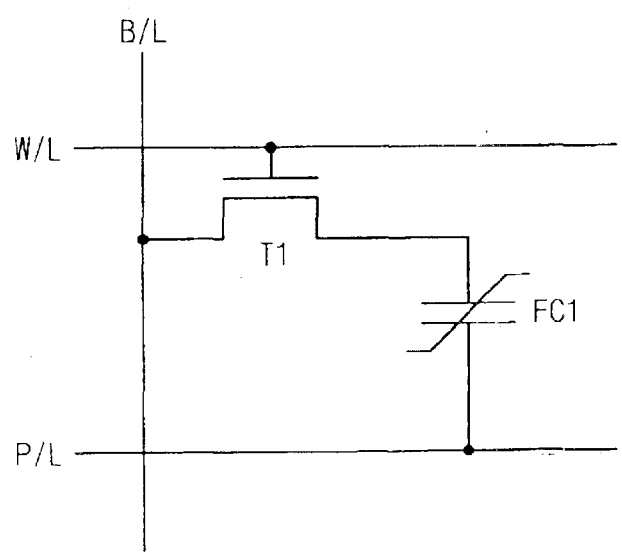
FIG. 2 is a structural diagram illustrating a conventional FRAM cell device.
Figure 3A:
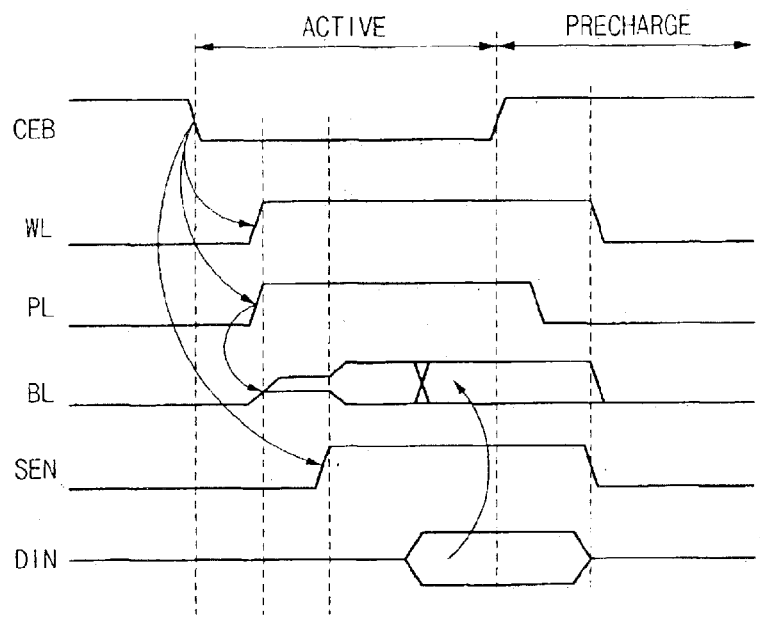
FIGS. 3a and 3b are timing diagrams illustrating read and write operations of the conventional FRAM of FIG. 2.
Figure 3B:
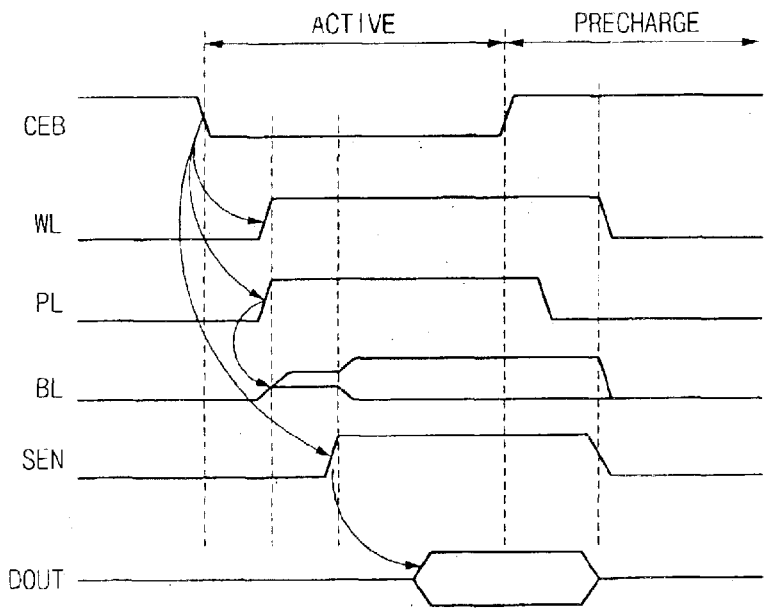
Figure 4:
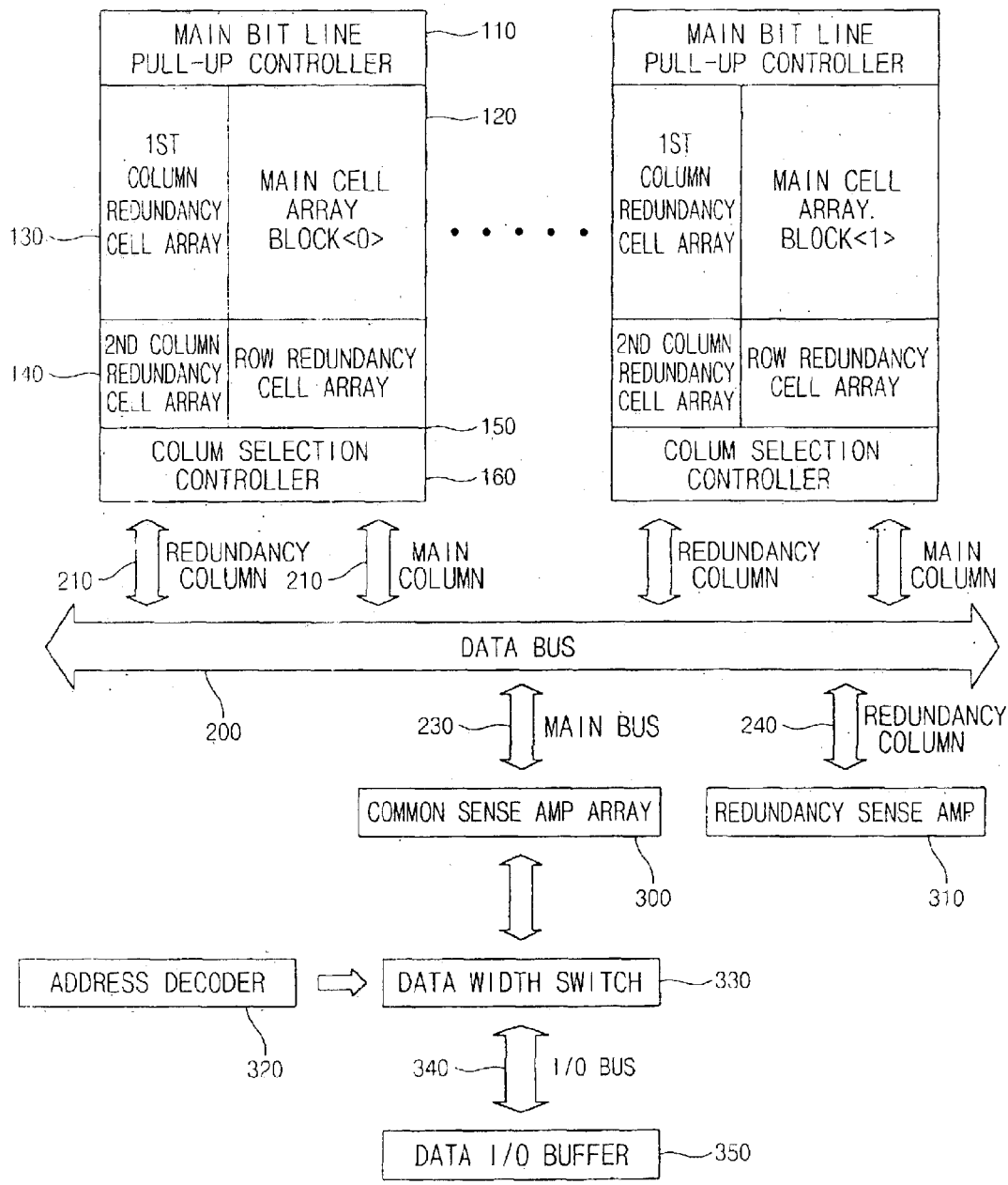
FIG. 4 is a block diagram illustrating the structure of a FRAM according to the present invention.

FIG. 4 is a block diagram illustrating the structure of a FRAM according to the present invention. The disclosed FRAM comprises a main bitline pull-up controller 110, a main cell array 120, column redundancy cell arrays 130 and 140, a row redundancy cell array 150, and a column selection controller 160.

The column redundancy cell, arrays 130 and 140 are connected to a data bus unit 200 via the column selection controller 160 and a redundancy column 210. The main cell array 120 is connected to the main cell array 120 via the column selection controller 160 and a main column 220. The redundancy column 210 is connected to a redundancy sense amplifier array unit 310 via the data bus unit 200 and a redundancy bus 240. The main column 220 is connected to a common sense amplifier via the data bus unit 200 and the main bus 230.

Figure 5:
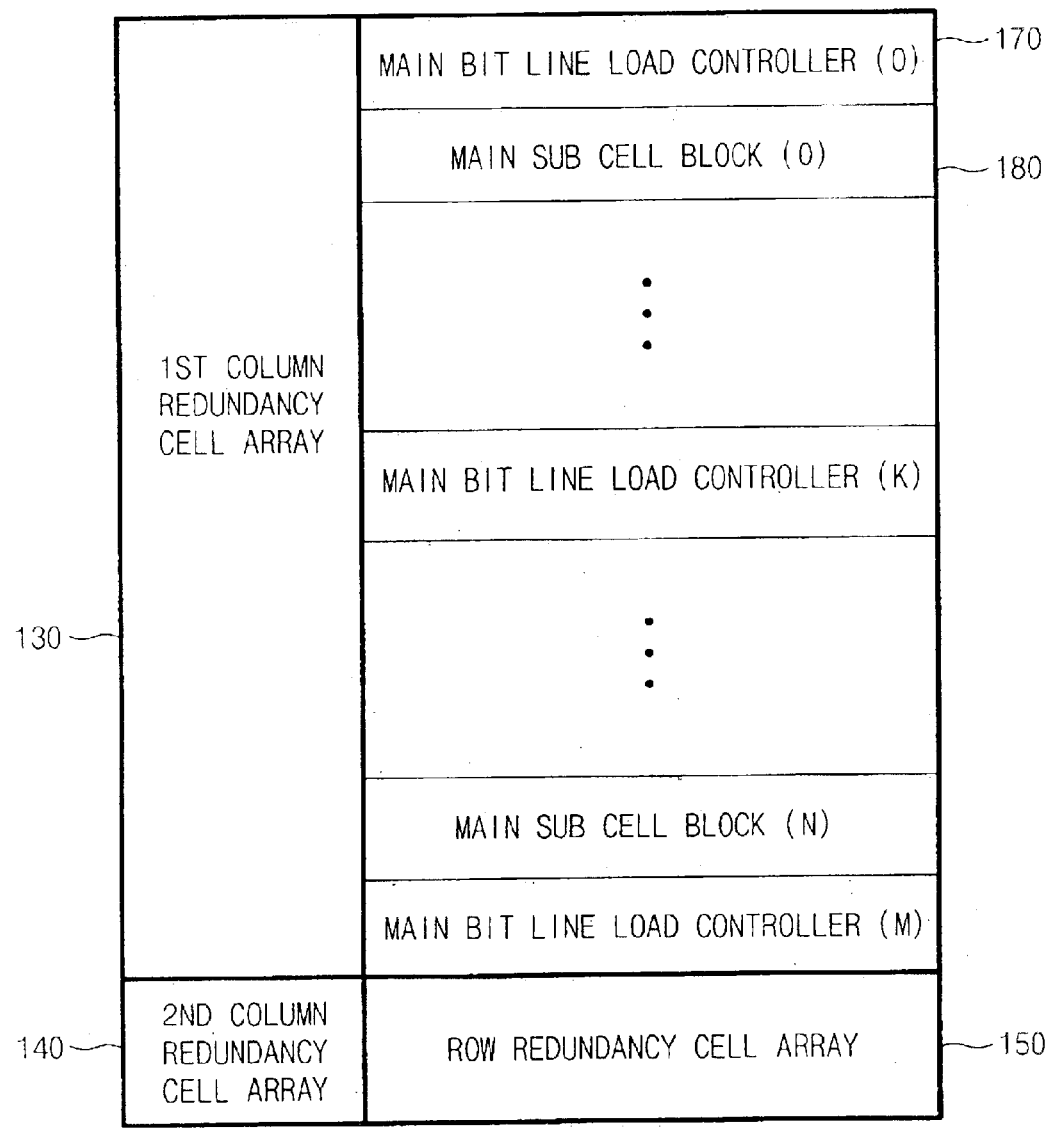
FIG. 5 is a detailed structure diagram illustrating a memory cell block of FIG. 4.

FIG. 5 is a detailed block diagram illustrating the memory cell array 120 and the redundancy cell arrays 130, 140 and 150 of FIG. 4. The main cell array 120 includes one or more main bitline load controllers 170 and a plurality of main sub cell blocks 180.

The row redundancy cell array 150 is arranged to share main bitlines with the main cell array 120. When cells in the main cell array 120 are not normally operated by wordline failure, a predetermined number of redundancy memory cells in the row redundancy cell array 150 repair the cells.

The column redundancy cell array is divided into the first column redundancy cell array 130 and the second column redundancy cell, array 140. The first column redundancy cell array 130 is configured to share wordlines and platelines with the main cell array 120. The second column redundancy cell array 140 is configured to share redundancy wordlines and redundancy platelines with the row redundancy cell array 150, and to share a redundancy pain bitline with the first column redundancy cell array 130.

When cells in the main cell array 120 are not operated by bitline failure, the first column redundancy cell array 130 repairs the calls. When cells in a row redundancy cell are not operated by bitline failure, the second column redundancy cell array 140 repairs the cells.

Figure 6:
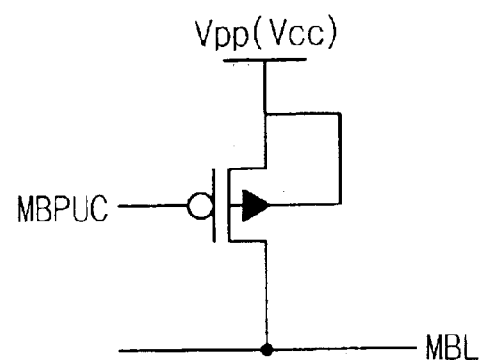
FIG. 6 is a circuit diagram illustrating a bitline pull-up controller of the memory cell of FIG. 4.

FIG. 6 is a circuit diagram illustrating the bitline pull-up controller 110 of the memory cell of FIG. 4.

The main bitline pull-up controller 110 comprises a PMOS transistor having a gate connected to a control signal MBPUC, a source connected to a Vpp or a Vcc, and a drain connected to a main bitline or a redundancy main bitline. The main bitline pull-up controller 110 pulls up the main bitline or the redundancy main bitline to a high level in a precharge operation.

Figure 7:
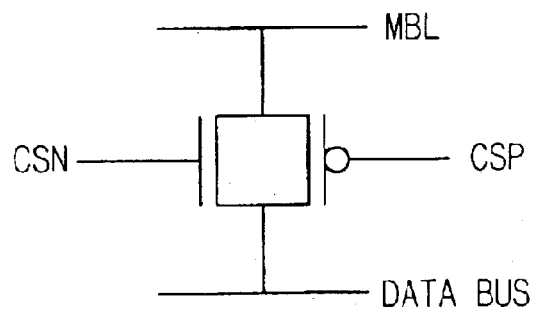
FIG. 7 is a circuit diagram illustrating a column selection controller of the memory cell of FIG. 4.

FIG. 7 is a circuit diagram illustrating the column selection controller 160 of the memory cell of FIG. 4. The column selection controller 160 comprises a transmission gate for connecting a main bitline MBL to a main column line, and a redundancy main bitline MBL to a redundancy column line in response to a control signals CSN and CSP.

Figure 8:
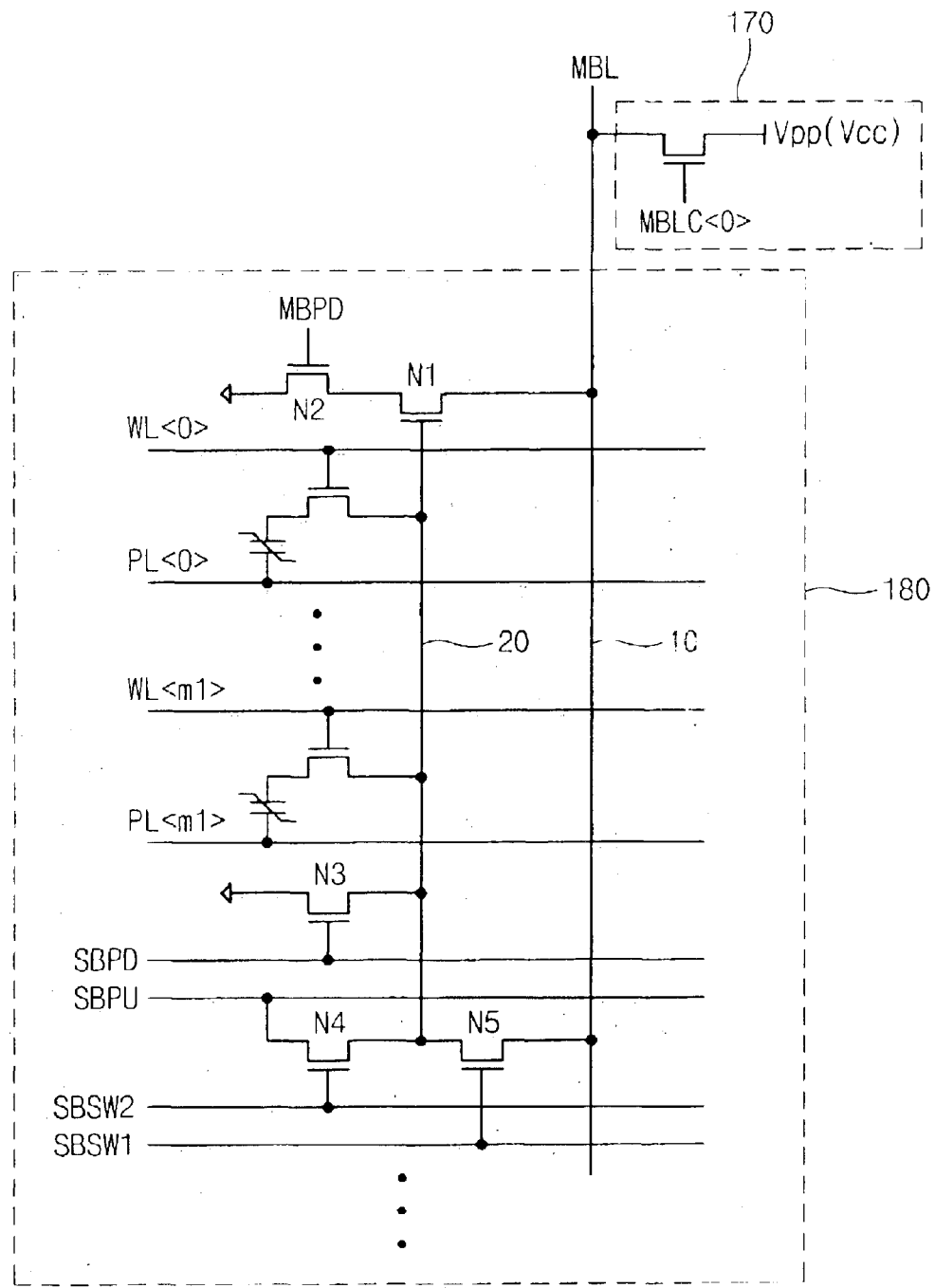
FIG. 8 is a detailed structural diagram illustrating a main bitline load controller and a main sub cell block of FIG. 5.

FIG. 8 is a detailed circuit diagram illustrating the main bitline load controller 170 and the main sub cell block 180 of FIG. 5. Only one main sub cell block 180 is illustrated herein for convenience. The main bitline load controller 170 comprises a PMOS transistor having a gate connected to a control signal MBLC, a source connected to a Vpp or a Vcc, and a drain connected to a main bitline 10.

When the control signal MBLC is activated, the main bitline load controller 170 serves as load of the main bitline 10. A detection voltage of the main bitline 10 is determined by load and current levels of the main bitline load controller 170. The current level is determined by a transistor N1. A plurality of the main bitline load controllers 170 are connected one by one to a plurality of the main bitline 10. However, a plurality of main bitline load controllers 170 may be connected to one main bitline according to preferred embodiments. Each main bitline load controller 170 is arranged for a predetermined number of the main sub cell blocks 180, thereby reducing driving load.

Each main sub cell block 180 comprises a sub bitline 20, a plurality of unit memory cells, and NMOS transistors N1, N2, N3, N4 and N5. Each unit memory cell is connected to a wordline WL<m>, a plateline PL<m> and the sub bitline 20. The NMOS transistor N1 for regulating current has a gate connected to a first terminal of the sub bitline 20, and a drain connected to the main bitline 10. The NMOS transistor N2 has a gate connected to a control signal MBPD, a drain connected to a source of the NMOS transistor N1, and a source connected to ground. The NMOS transistor N3 has a gate connected to a control signal SBPD, a drain connected to a second terminal of the sub bitline 20, and a source connected to ground. The NMOS transistor N4 has a gate connected to a control signal SBSW2, a source connected to the second terminal of the sub bitline SBL, and a drain connected to a control signal SBPU. The NMOS transistor N5 has a gate connected to a control signal SBSW1, a drain connected to the main bitline 10, and a source connected to the second terminal of the sub bitline 20.

Since a plurality of sub bitlines 20 in the main bitline 10 are activated one by one at a time, driving load of the main bitline is reduced to that of one sub bitline 20. The sub bitline 20 is connected to the main bitline 10 by the control signal SBSW1.

When the control signal SBPD for regulating the pull-down NMOS transistor N3 is enabled, a potential of the sub bitline 20 is regulated to a ground level. The control signal SBPU signal regulates a power voltage to be supplied to the sub bitline 20. The control signal SBSW2 controls the flow of signals between the control signal SBPU and the sub bitline 20. The control signal SBSW1 controls the flow of signals between the sub bitline 20 and the main bitline 10. A plurality of unit cells are connected to the sub bitline 20. The sub bitline 20 is configured to be connected to the gate of the NMOS transistor N1, and to regulate the detection voltage of the main bitline 10.

Figure 9:
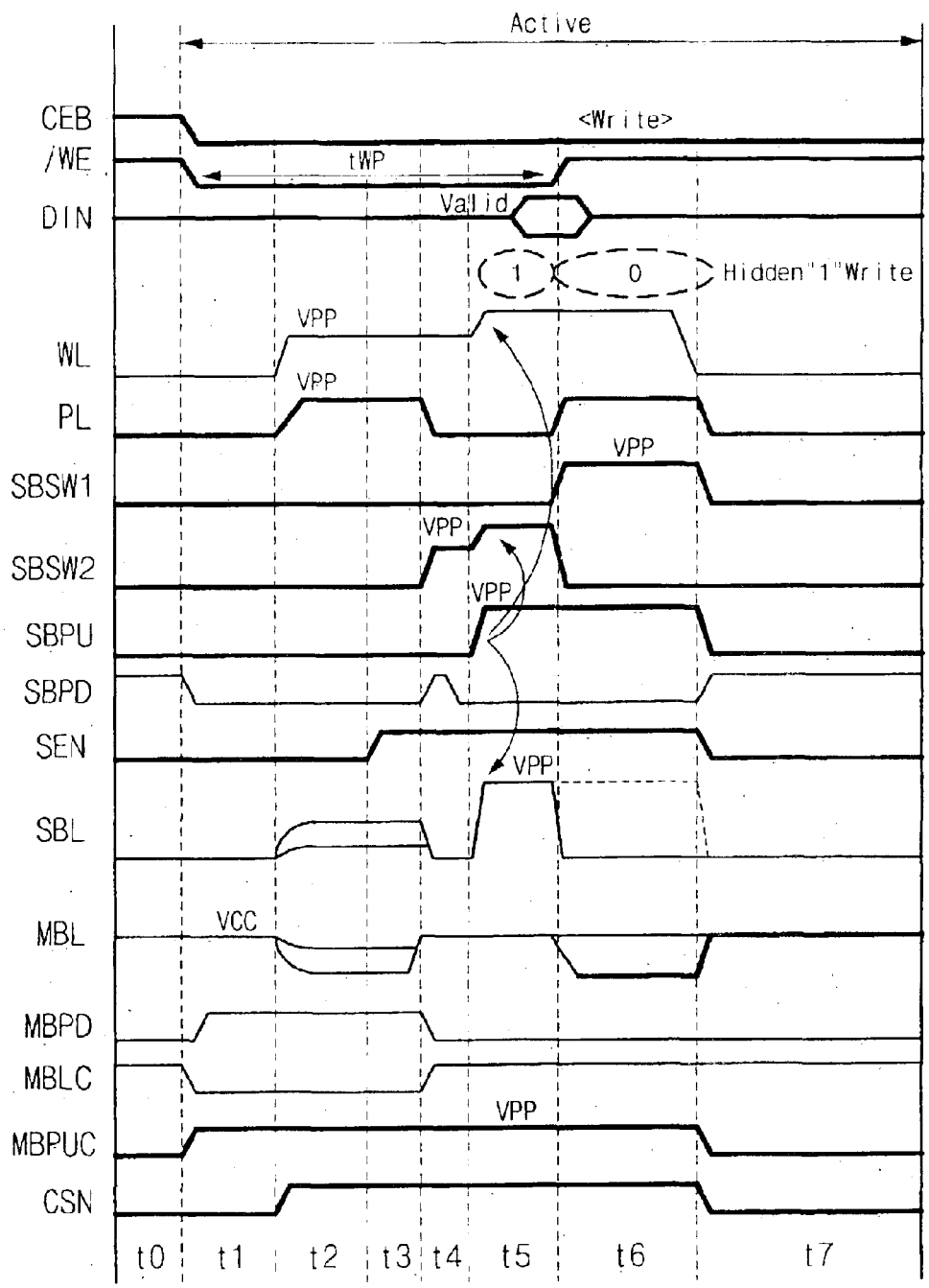
FIG. 9 is a timing diagram illustrating a write operation of the main sub cell block of FIG. 8.

FIG. 9 is a timing diagram illustrating a write operation of the main sub cell block of FIG. 8.

In intervals t2 and t3, a level of a signal written in a cell is detected. In an interval t4, a self-boosting operation is prepared. In an interval t5, a "high" level signal is written. In an interval t6, a "low" level signal is written. The interval t6 is not required when the "high" level is written.

In the intervals t2 and t3, when data of the cell is "high", a voltage of the sub bitline SBL 20 also becomes at a "high" level. As a result, as current flowing in the NMOS transistor N1 becomes larger, the voltage of the main bitline MBL 10 becomes lower than a reference level. On the other hand, when the data of the cell is "low", the voltage of the sub bitline 20 also becomes at a "low" level. As a result, as the current flowing in the NMOS transistor N1 becomes smaller, the voltage of the main bitline 10 becomes higher than the reference level.

In the interval t4, if the control signal SBSW2 is at a "high" level while the control signal SBPU is maintained at a "low" level, charges are stored in a parasitic capacitor between the gate and the source or between the gate and the drain of the NMOS transistor N4. In the interval t5, if the control signal SBPU is at a "high" level, potentials of the control signal SBSW2, the sub bitline 20 and the wordline WL<i> are boosted to an upper potential than a general "high" level as much as potential difference due to the charges. As a result, data "1" is automatically stored in the cell (t5).

If the data outputted into the main bitline 10 through an I/O buffer is "0", the control signal SBSW1 is activated, and the control signal SBSW2 is inactivated. Thereafter, when a potential of the plateline PL<i> is at a high level, the potential of the sub bitline 20 is also "0". As a result, as the charges stored in the cell moves to the sub bitline, the data "0" is written in the cell (t6).

Figure 10:
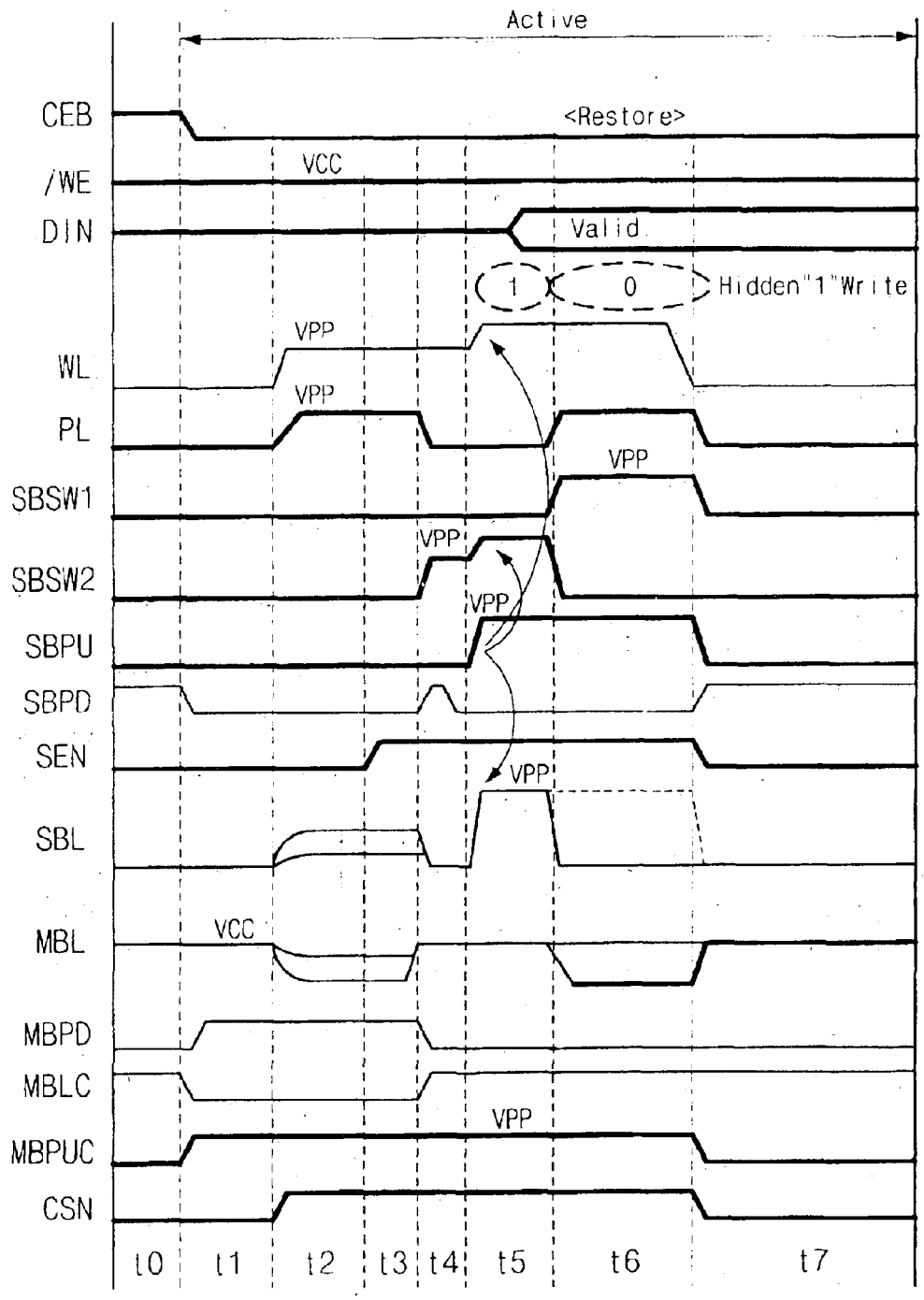
FIG. 10 is a timing diagram illustrating a read operation of the main sub cell block of FIG. 8.

FIG. 10 is a timing diagram illustrating a read operation of the main sub cell block of FIG. 8.

In intervals t2 and t3, a level of a signal written in a cell is detected. In an interval t5, data "1" is written. In an interval t6, data "0" is restored. The interval t6 is not required if the data "1" is written in the cell.

The operations in the intervals t2~t4 are identical to those of FIG. 9. In general, a restore operation is required after a read operation. Referring to FIG. 10, however, a restore operation is performed in the intervals t5 and t6. In the interval t5, data "1" is restored regardless of the originally stored value. In the interval t6, data "0" is restored. A restore operation is to rewrite temporarily stored read data from a memory cell. The explanation of the restore operation is omitted because it is identical to the write operation.

Figure 11:
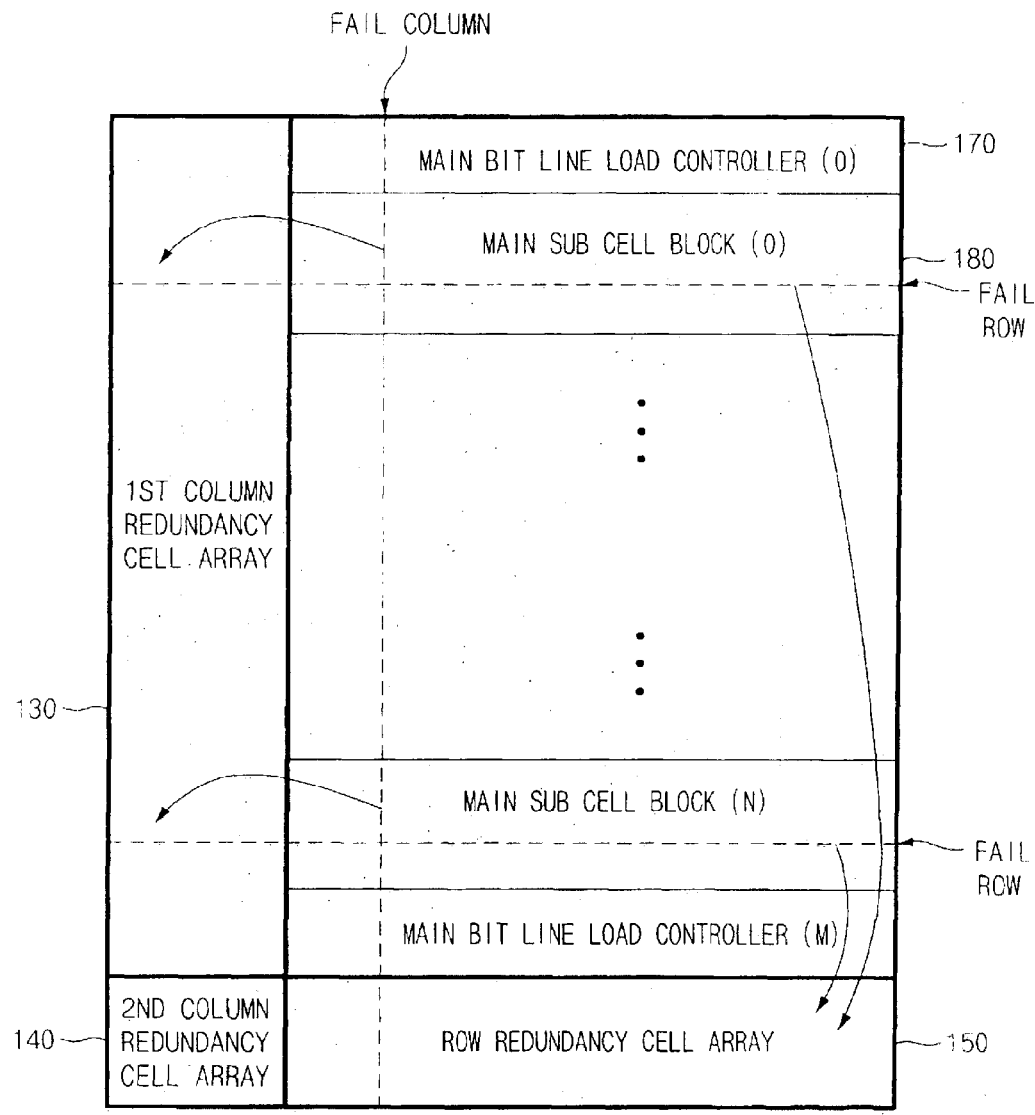
FIG. 11 is a block diagram illustrating a method of repairing failed cells using a redundancy cell array in the FRAM of FIG. 5.

FIG. 11 is a block diagram illustrating a method of repairing fail cells in the FRAM of FIG. 5. If a row fail occurs, it is repaired using the row redundancy cell array 150. If a column fail occurs, it is repaired using the column redundancy cell array 130 and 140.

Figure 12:
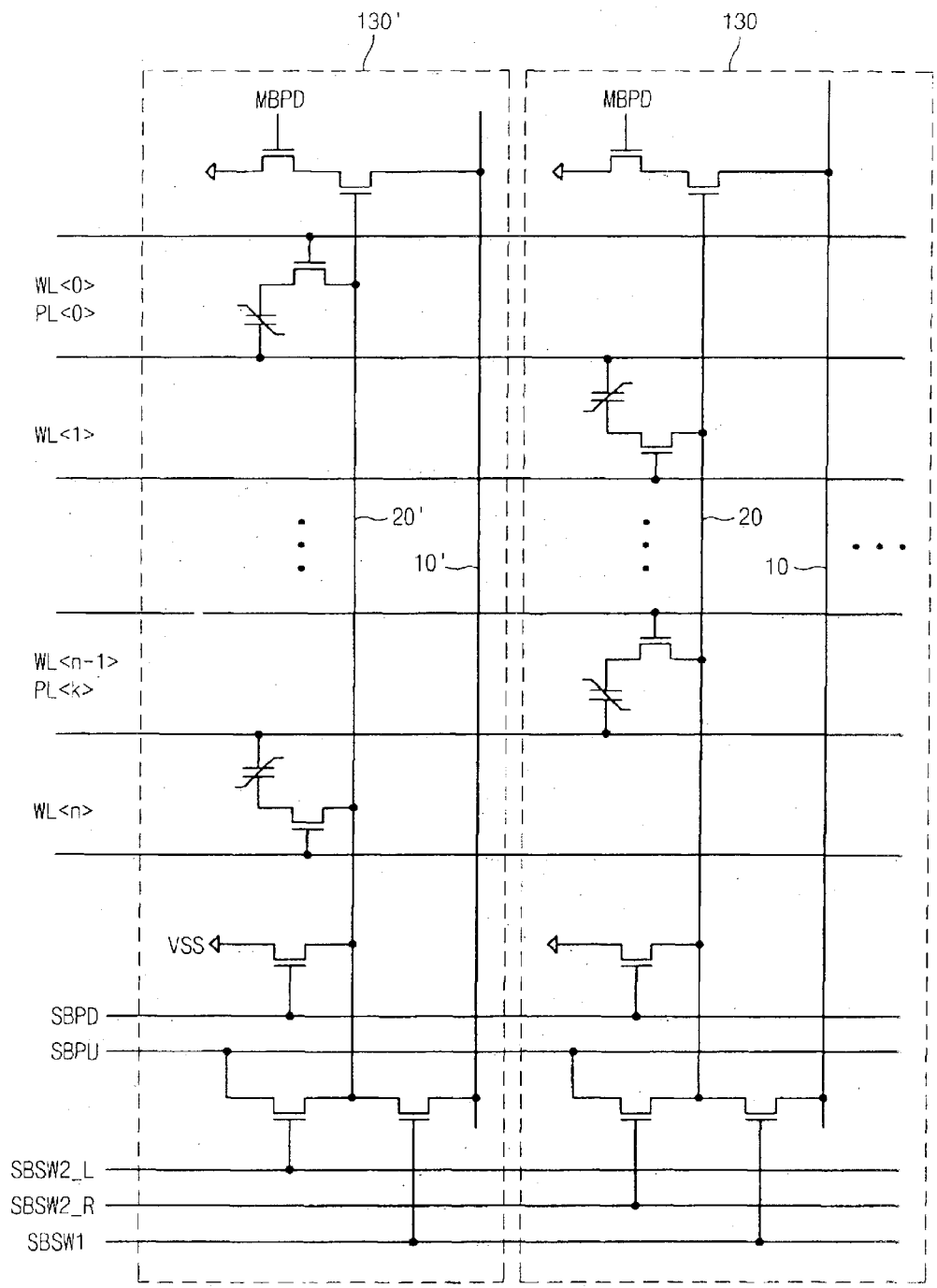
FIG. 12 is a structural diagram illustrating a first column redundancy cell array of FIG. 4 configured to have a folded bitline structure.

FIG. 12 is a structural diagram illustrating the first column redundancy cell array 130 having a folded bitline structure. In the folded bitline structure, a pair of redundancy main bitlines 10 and 10' correspond to one column address. A half of the cells having the same column address are connected to a main bitline 10 and the other half of the cells are connected to a main bitline 10'. More specifically, two memory cells commonly connected to a same plateline PL<0> are connected to wordlines WL<0> and WL<1>, respectively. One of two memory cells is connected to a redundancy sub bitline 20'. The other memory cell is connected to a redundancy sub bitline 20. The rest cells are similarly connected to each redundancy sub bitline. As a result, the number of platelines corresponds to a half of the number of wordlines.

The first column redundancy cell array 130 has the same structure as that of the main cell array 12 which is a repair object. Generally, a redundancy cell operates with a main cell simultaneously. However, data is read/written from/to a redundancy cell if a main cell is a fail cell, and only from/to a main cell if a main cell is not a fail cell. As a result, the control signals MBPD, SBSW1 and SBSW2 are shared with the main cell by the redundancy cell as shown in FIG. 12. Since the column redundancy cell array of the folded bitline structure comprises a pair of the main bitlines 10 and 10', the control signals SBSW2_L and SBSW2_R in the main cell correspond to those in the redundancy cell.

Figure 13:
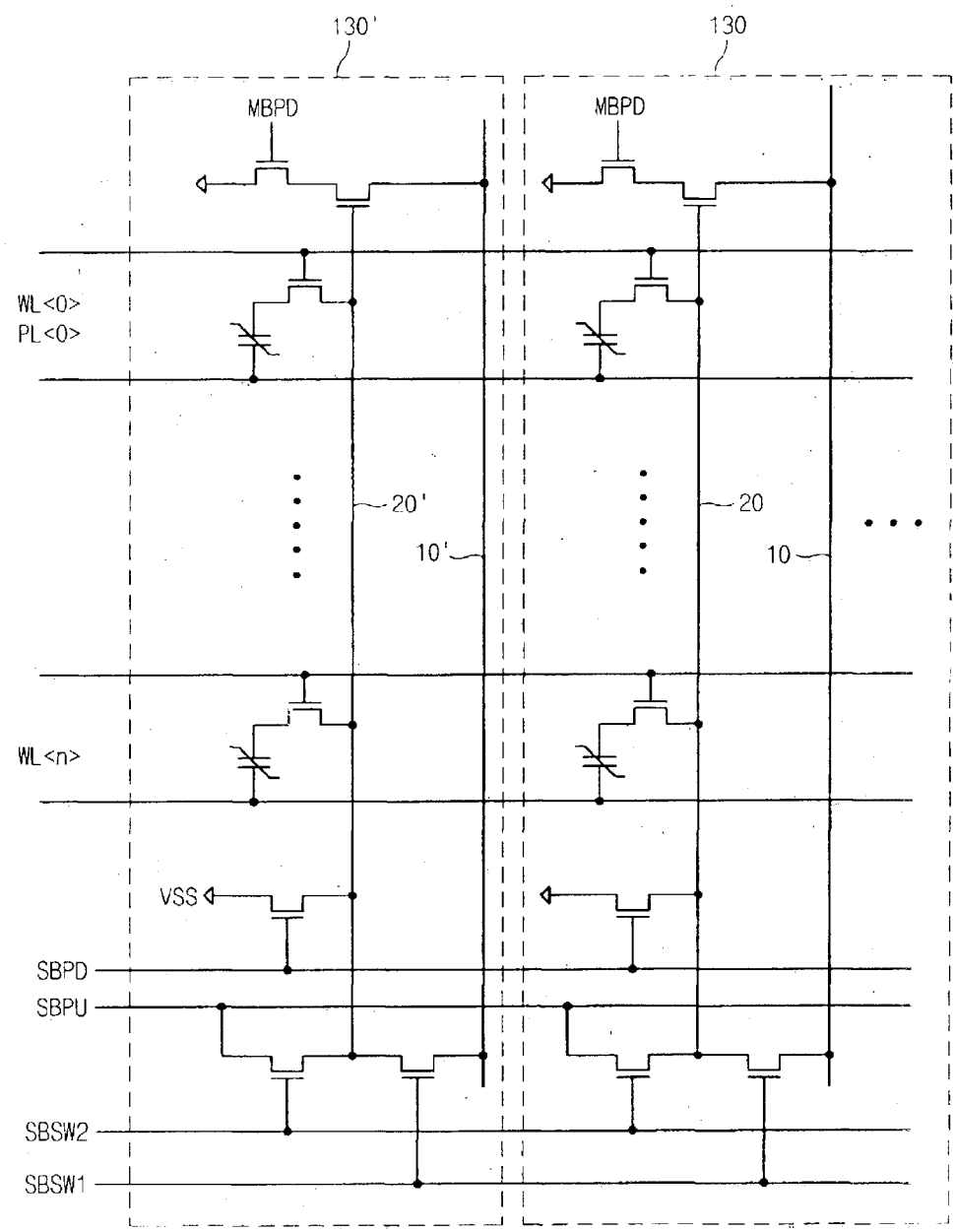
FIG. 13 is a structural diagram illustrating the first column redundancy cell array of FIG. 4 configured to have an open bitline structure.

FIG. 13 is a structural diagram illustrating the first column redundancy cell array configured to have an open bitline structure. In the open bitline structure, one column address corresponds to one main bitline. As a result, all cells having the same column address are connected to one main bitline. One main bitline in the open bitline structure corresponds to two main bitlines in the folded bitline structure. The control signals SBSW1, SBSW2 and MBPD are shared by the first column redundancy cell arrays 130 and 130' with the main cell arrays in the same manner as the folded structure.

In the preferred embodiment, the first column redundancy cell arrays 130 and 130' have the same structure as that of the main cell arrays, and the second column redundancy cell array 140 has the same structure as that of the corresponding row redundancy cell array 150.

Figure 14:
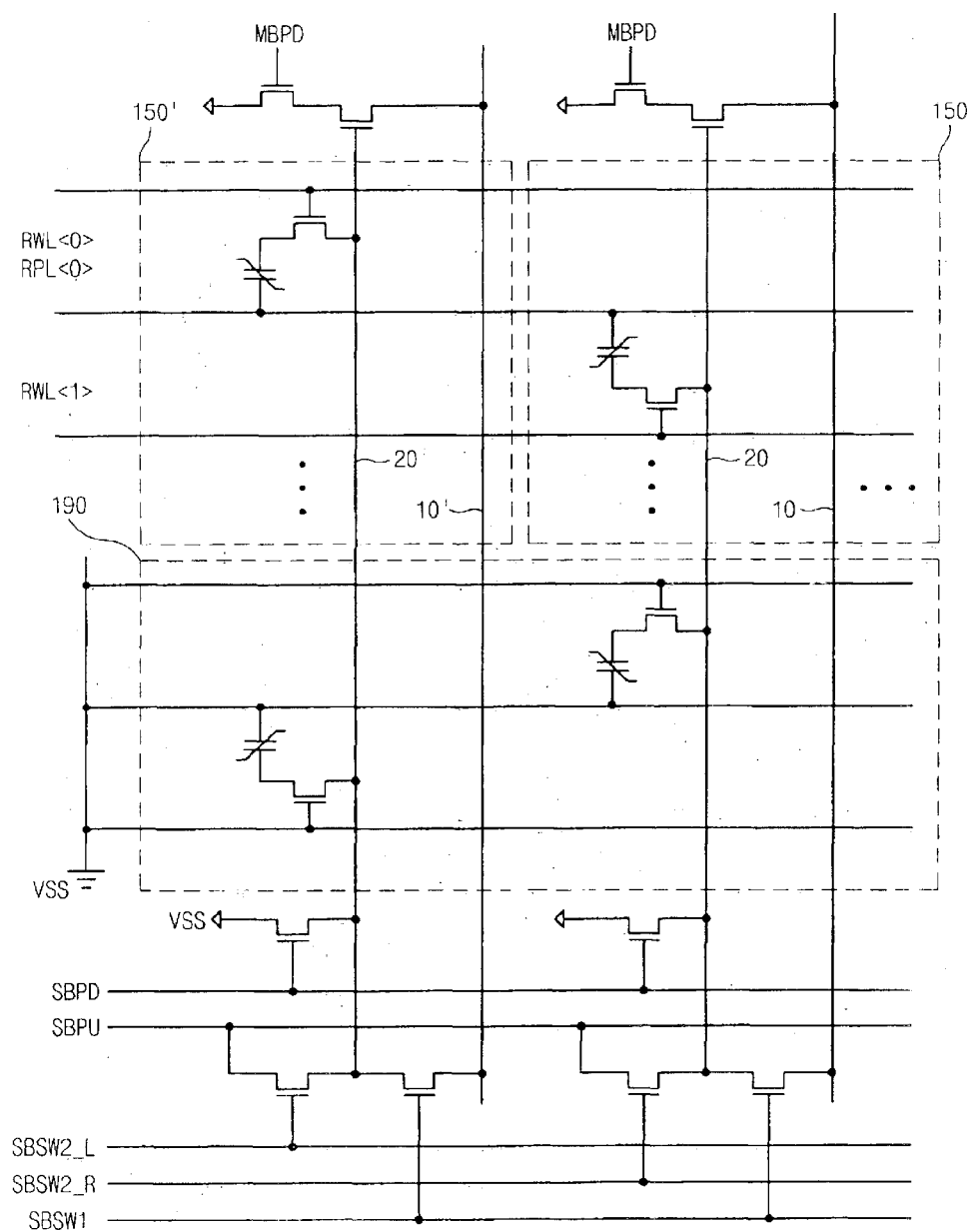
FIGS. 14 and 15 are a first example of a row redundancy cell array of FIG. 4.
Figure 15:
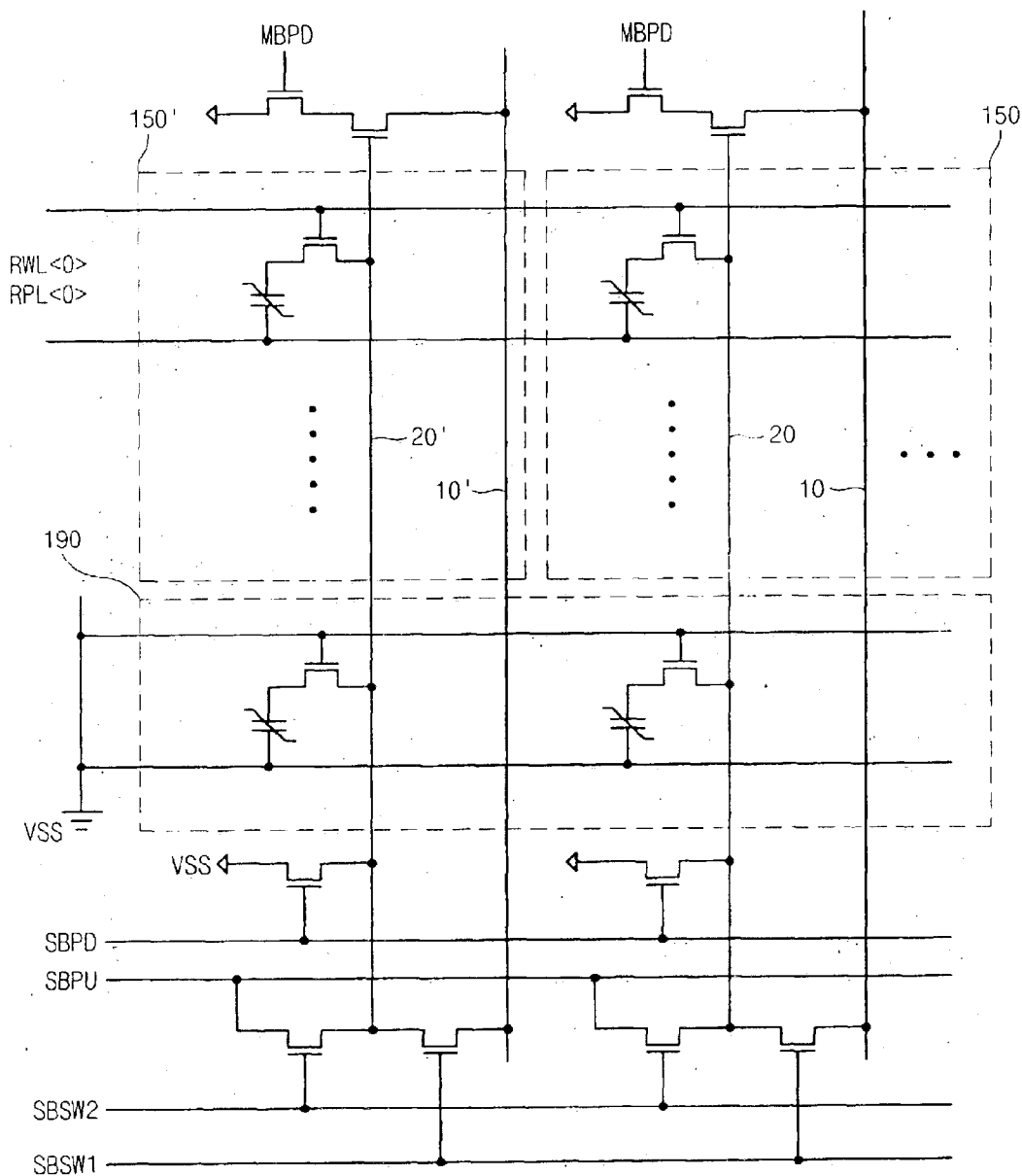

FIGS. 14 and 15 are a first example of the row redundancy cell array 140 of FIG. 4. FIG. 14 shows a cell array of the folded bitline structure while FIG. 15 shows a cell array of the open bitline structure.

In the first example, the structures of sub cell blocks in row redundancy cell arrays 150 and 150' are basically identical to those in the main sub cell block. The row redundancy cell arrays 150 and 150' may comprise a plurality of sub cell blocks. Wordlines and platelines, which are not used in redundancy cells, are all grounded in the first example.

Since the structure of the redundancy cell array is identical to that of the main cell array, and the effect of driving load is also identical to each other, the control operations may be simplified. The first example is useful when the redundancy cell array has many effective row redundancy cells.

Figure 16:
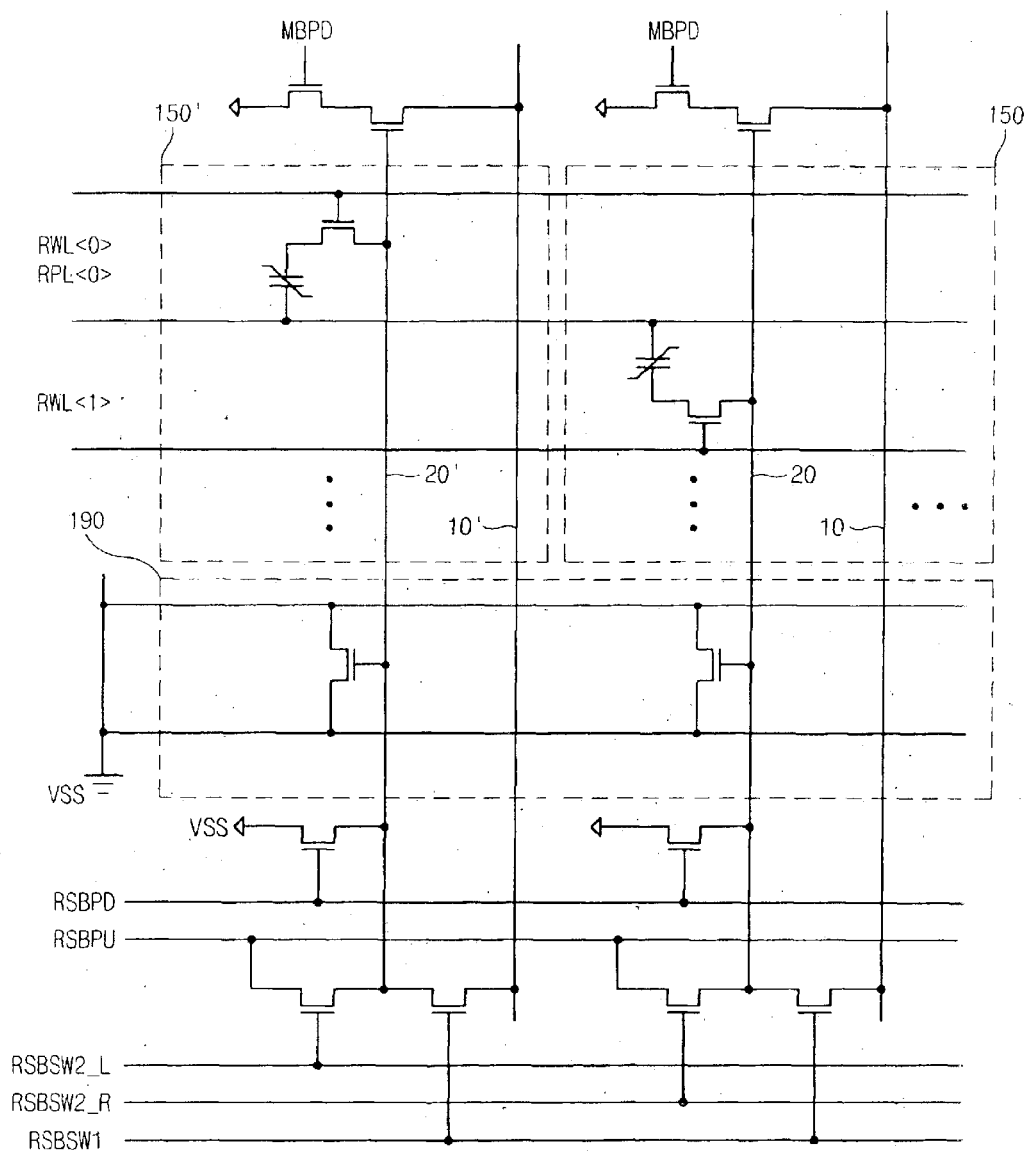
FIGS. 16 and 17 are a second example of the row redundancy cell array of FIG. 4.
Figure 17:
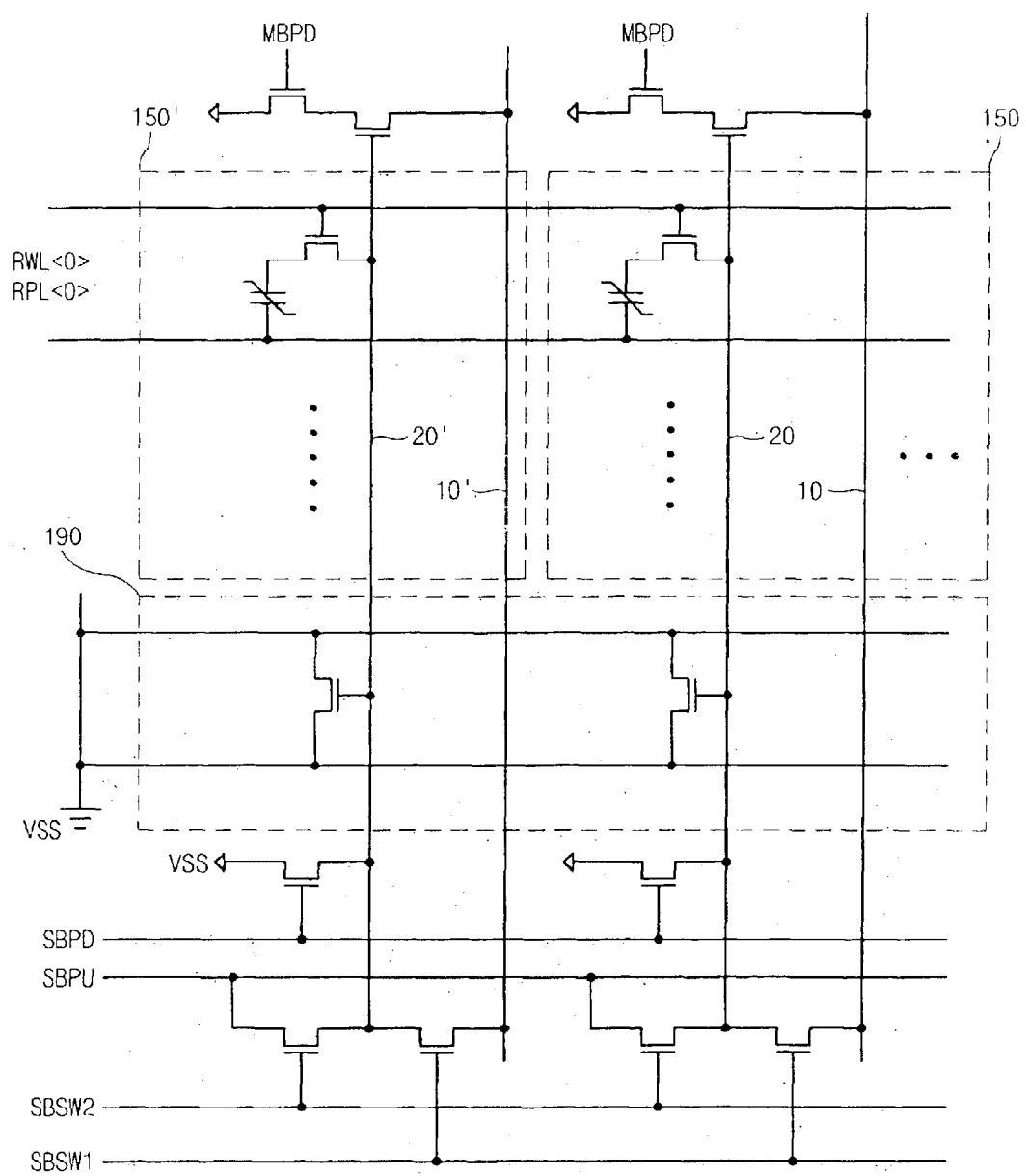

FIGS. 16 and 17 are a second example of the row redundancy cell array 150 of FIG. 4. FIG. 16 shows a cell array of the folded bitline structure while FIG. 17 shows a cell array of the open bitline structure.

In the second example, the structures of sub cell blocks in row redundancy cell arrays 150 and 150' are basically identical with that of the main sub cell block. Instead of unused cells, a capacitor 190 of equivalent capacitance is used herein. In the second example, a NMOS transistor is used as a capacitor having the same capacitance as that of the main cell. Since a gate of the NMOS transistor has a large capacitance per unit area, the area of the redundancy cell array may be reduced. The gate of the NMOS transistor is connected to the sub bitlines 20 and 20', and a drain and a source are grounded.

Figure 18:
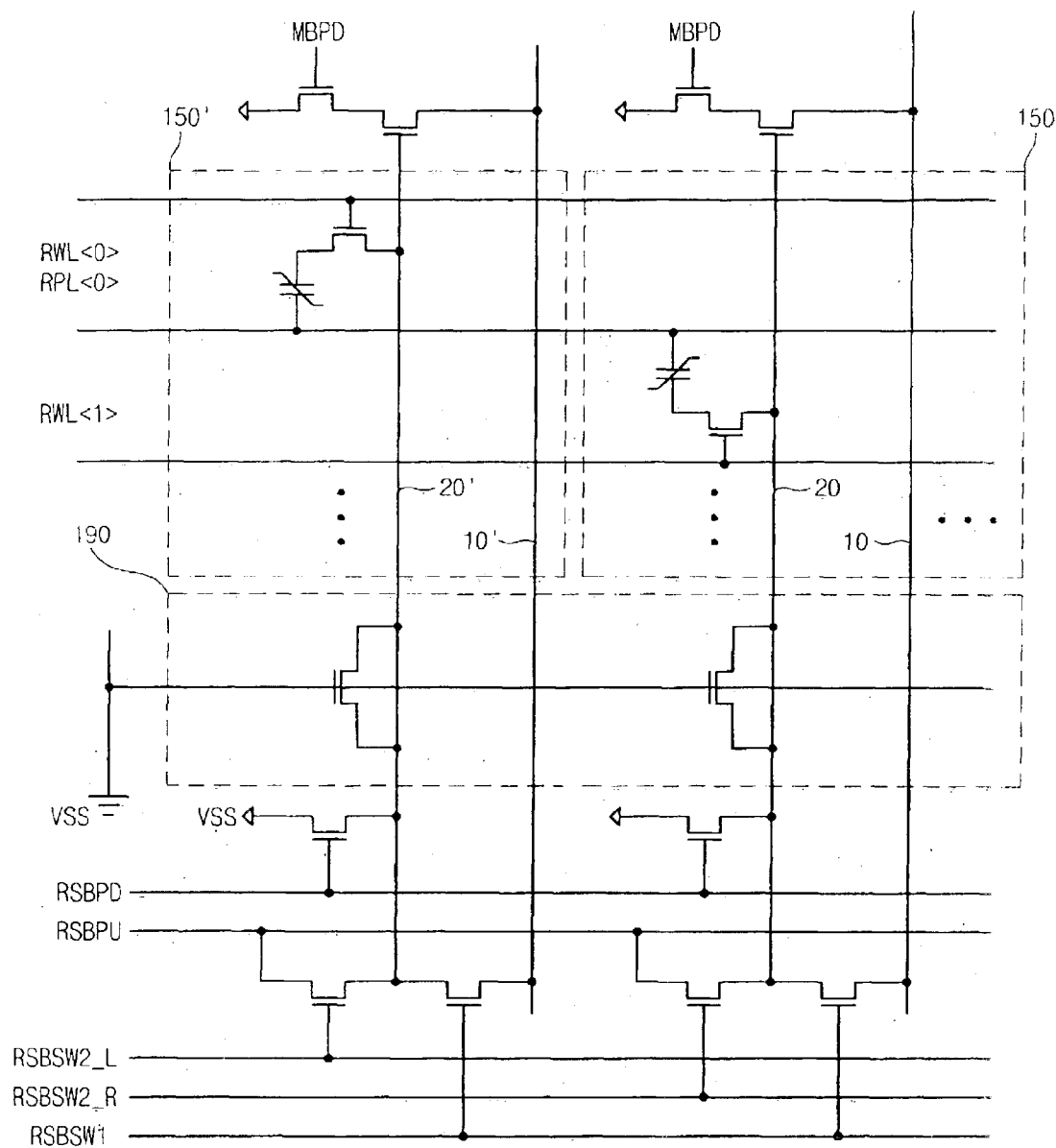
FIGS. 18 and 19 are a third example of the row redundancy cell array of FIG. 4.
Figure 19:
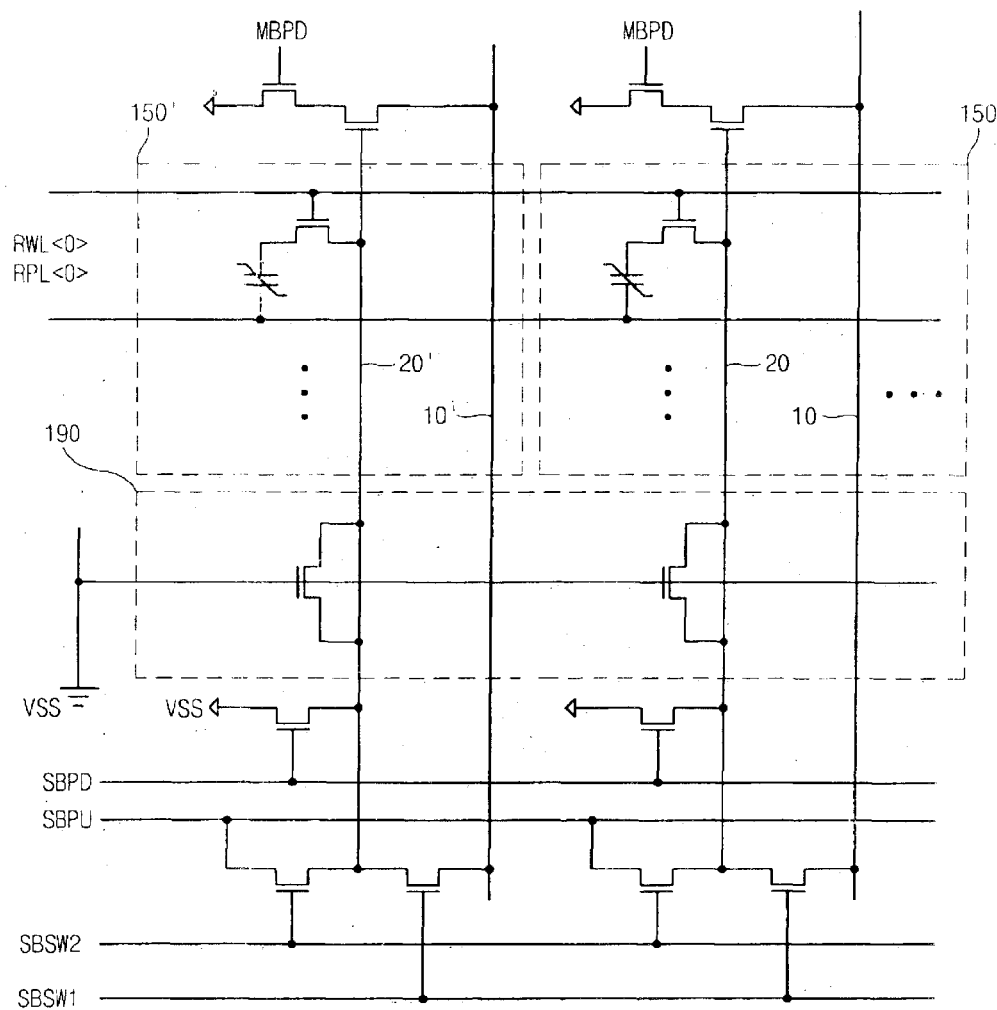

FIGS. 18 and 19 are a third example of the row redundancy cell array 150 of FIG. 4. FIG. 18 shows a cell array of the folded bitline structure while FIG. 19 shows a cell array of the open bitline structure.

The third example is identical to the second example except the structure and the operation of the NMOS transistor 190. The NMOS transistor 190 of the third example has a drain and a source connected to the sub bitlines 20 and 20', and a gate connected to ground. The drain of the NMOS transistor 190 in a unit cell of the main cell array is also connected to the sub bitline 20. Therefore, the dependency of capacitance on voltages of the sub bitlines 20 and 20' is similar to that of the sub bitline 20 in the main cell.

Figure 20:
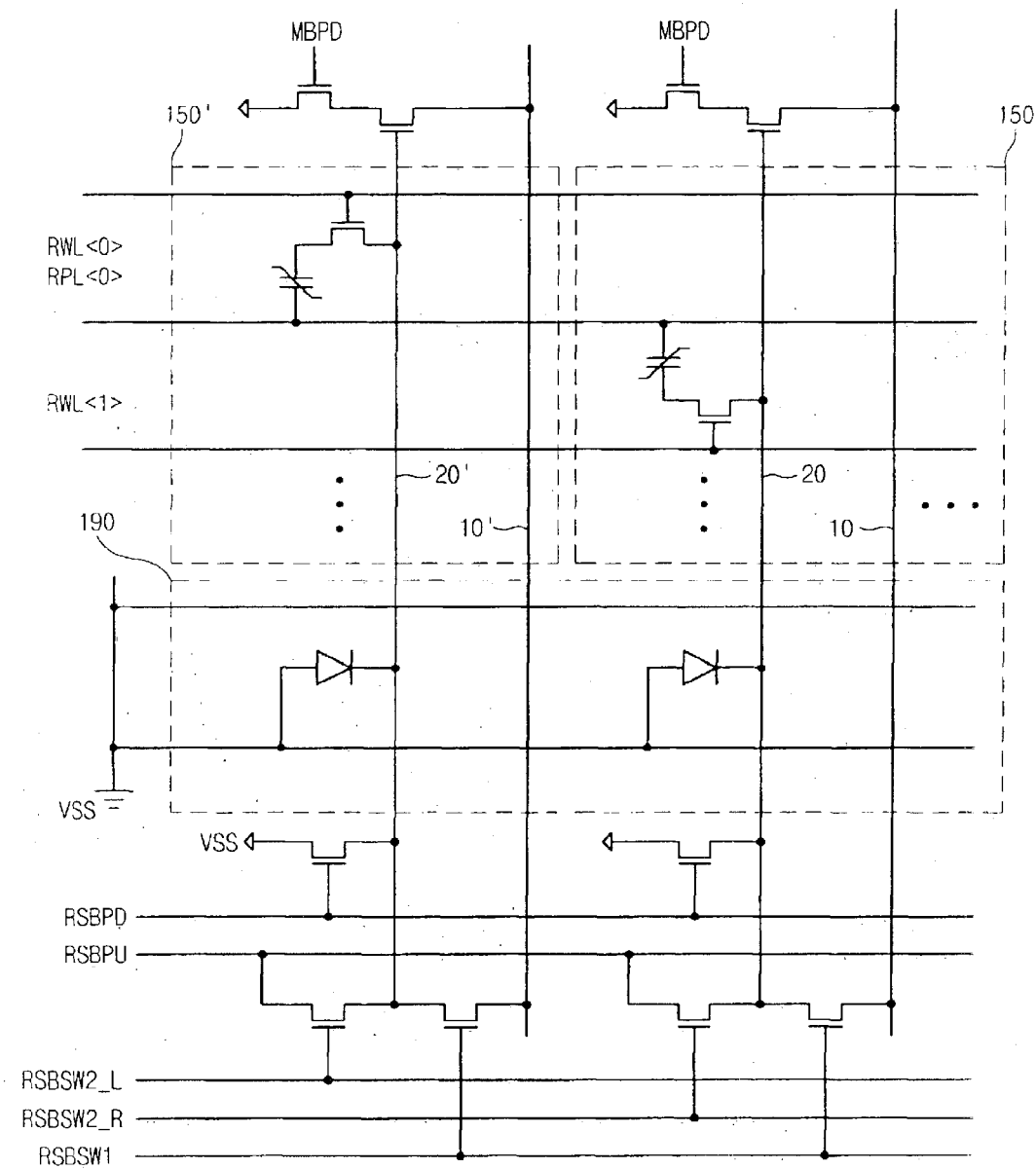
FIGS. 20 and 21 are a fourth example of the row redundancy cell array of FIG. 4.
Figure 21:
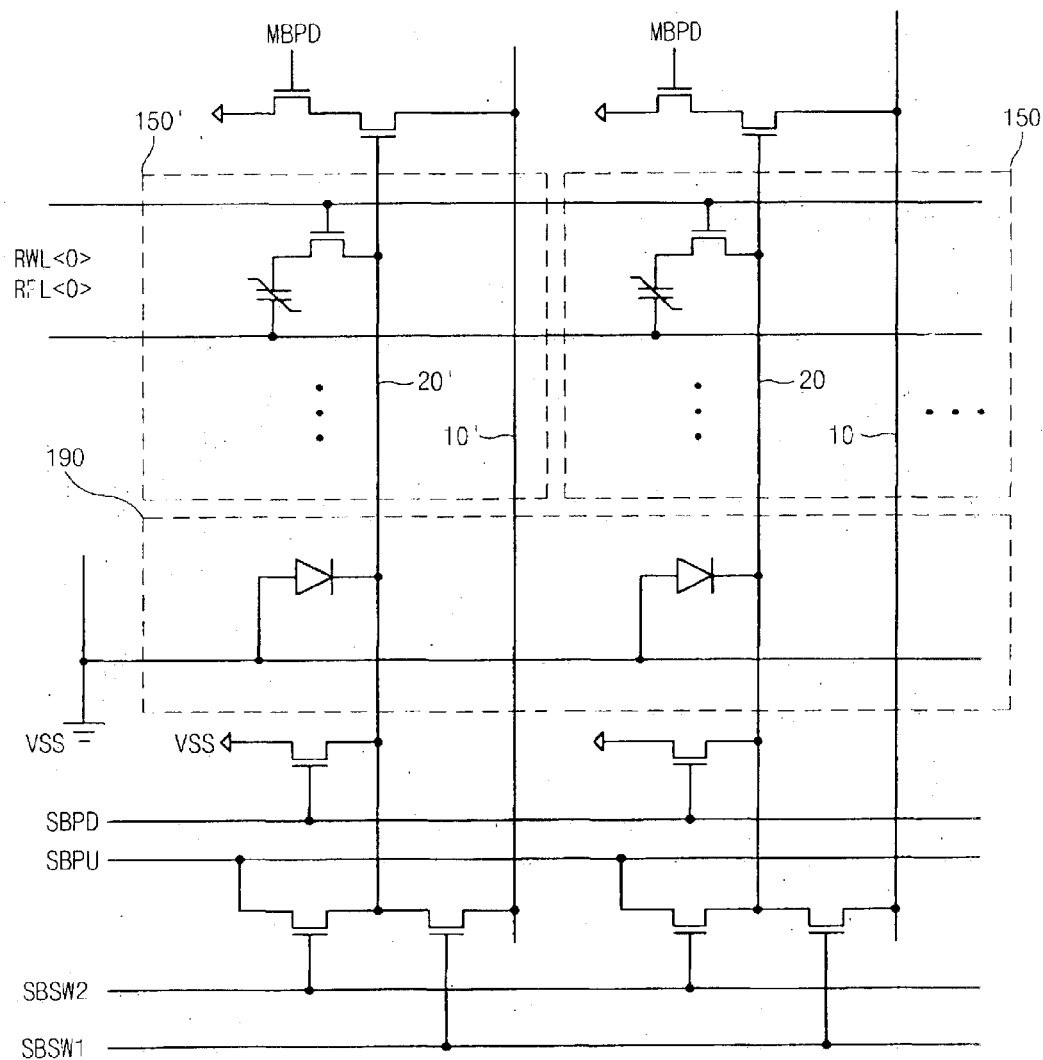

FIGS. 20 and 21 are a fourth example of the row redundancy cell array of FIG. 4. FIG. 20 shows a cell array of the folded bitline structure while FIG. 21 shows a cell array of the open bitline structure.

In the fourth example, the structures of sub cell blocks in row redundancy cell arrays 150 and 150' are identical to those of the main sub cell block. Instead of unused cells, a diode 190 of equivalent capacitance is used herein unlike the first example. Since a N+ terminal of the diode has a large capacitance per unit area, the size of the redundancy cell array may be reduced by using the diode. A P+ terminal of the diode is grounded.

Figure 22:
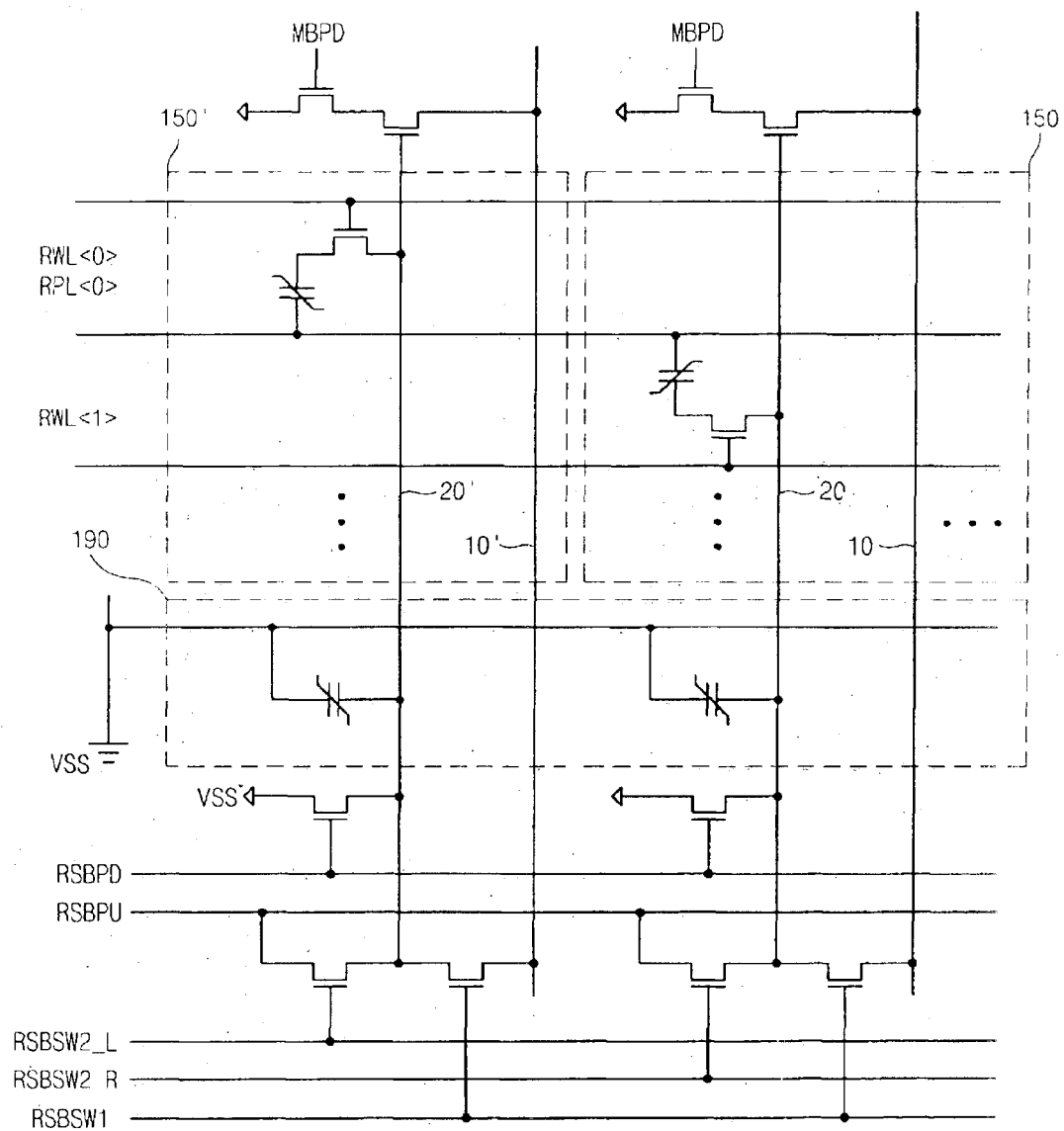
FIGS. 22 and 23 are a fifth example of the row redundancy cell array of FIG. 4.
Figure 23:
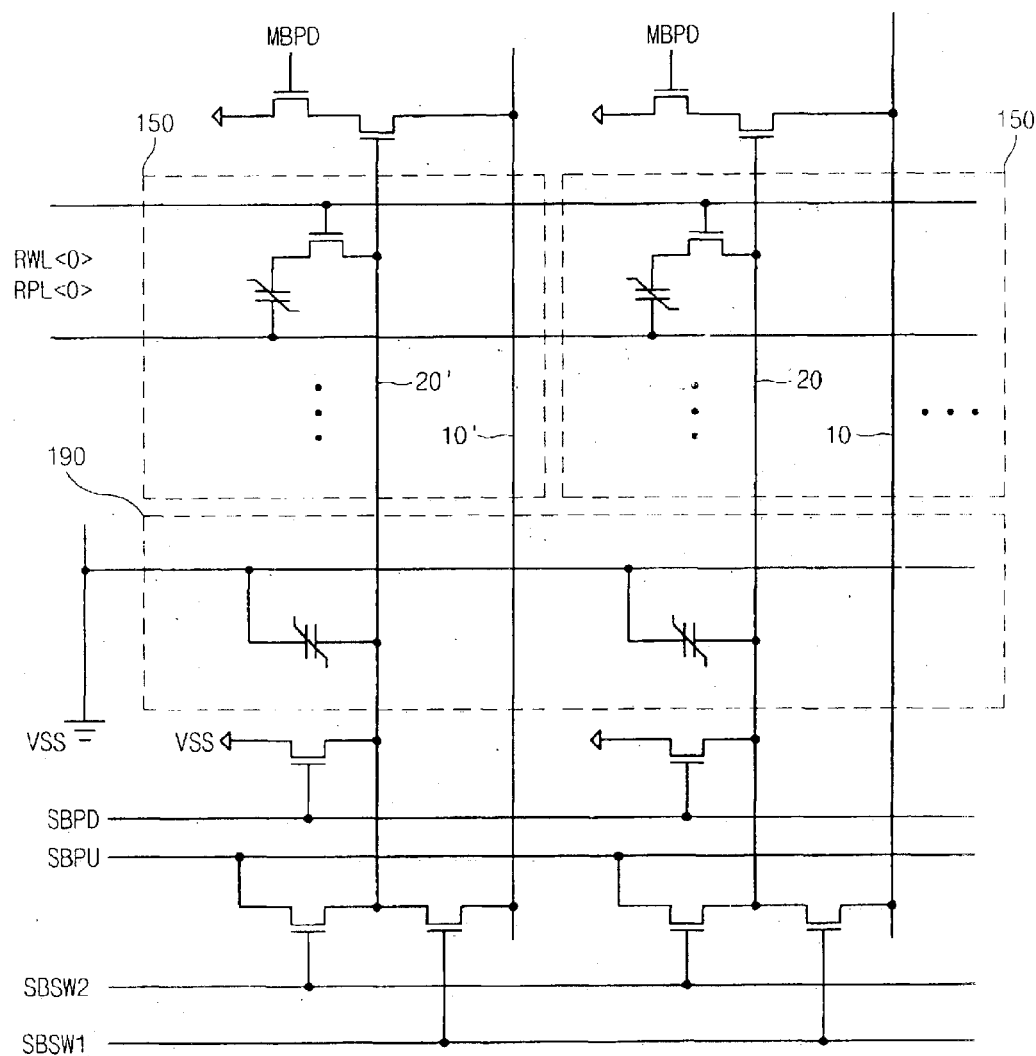

FIGS. 22 and 23 are a fifth example of the row redundancy cell array of FIG. 4. FIG. 22 shows a cell array of the folded bitline structure while FIG. 23 shows a cell array of the open bitline structure.

In the fifth example, the structures of sub cell blocks in row redundancy cell arrays 150 and 150' are identical with that of the main sub cell block. Instead of unused cells, a ferroelectric capacitor 190 of equivalent capacitance is used herein unlike the first example. Since the ferroelectric capacitor has a large capacitance per unit area, the size of the redundancy cell array may be reduced by using the ferroelectric capacitor.

In FIGS. 14 through 23, the second column redundancy cell array 140 is to the row redundancy, cell array 150 what the first column redundancy cell array 130 is to the main cell array 120. Thus, the detailed explanation is omitted.

As discussed earlier, a redundancy cell array is provided which has the same characteristic as that of a main cell array. In addition, the layout area of the whole memory may be reduced by decreasing the size of the redundancy cell array.

What is claimed is:

1. A ferroelectric memory device, comprising:
   a main cell array including main bitlines and sub bitlines;
   a row redundancy cell array configured to share the main bitlines with the main cell array;
   a first column redundancy cell array configured to share wordlines and platelines with the main cell array;
   a second column redundancy cell array configured to share redundancy wordlines and redundancy platelines with the row redundancy cell array, and to share redundancy main bitlines with the first column redundancy cell array;
   main bitline pull-up controllers for pulling up the main bitlines and the redundancy main bitlines in response to first control signals, respectively; and
   column selection controllers for connecting data bus lines to the main bitlines and the redundancy main bitlines in response to column selection signals, respectively.

2. The device of claim 1, wherein each of the redundancy main bitlines is connected to a redundancy sense amplifier via a redundancy bus line, and
   each of the main bitlines is connected to a main sense amplifier via a main bus line.

3. The device of claim 1, wherein the main cell array includes:
   main bitline load controllers configured to be connected between a positive power and the main bitlines, and to control the flow of current in response to a second control signals, respectively; and
   main sub cell blocks configured to be serially arranged between the main bitline pull-up controllers and the column selection controllers, and to be connected to the main bitlines at their both end, respectively.

4. The device of claim 3, wherein only one of the main bitline load controllers is connected to each of the main bitlines.

5. The device of claim 3, wherein at least two of the main bitline load controllers are connected to each of the main bitlines, and evenly placed apart from each other.

6. The device of claim 1, wherein each of the main bitline pull-up controllers is a PMOS transistor having a gate to receive each of the first control signals, a source connected to a positive power and a drain connected to each of the main bitlines.

7. The device of claim 1, wherein each of the column selection controllers is a transmission gate having a gate to receive each of the column selection signals, and both terminals connected to each of the data bus lines and each of the main bitlines, respectively.

8. The device of claim 3, wherein each of the main bitline load controllers is a PMOS transistor having a gate to receive each of the second control signals, a source connected to a positive power, and a drain connected to each of the main bitlines.

9. The device of claim 3, wherein each of the main sub cell blocks includes:
   a sub bitline configured to be connected in common to a plurality of unit memory cells each of which is connected to each of the wordlines and each of the platelines, respectively;
   a first NMOS transistor having a gate connected to a first terminal of the sub bitline, and a drain connected to each of the main bitlines;
   a second NMOS transistor having a gate connected to a third control signal, a drain connected to a source of the first NMOS transistor, and a source connected to ground;
   a third NMOS transistor having a gate connected to a fourth control signal, a drain connected to a second terminal of the sub bitline, and a source connected to ground;
   a fourth NMOS transistor having a gate connected to a fifth control signal, a source connected to the second terminal of the sub bitline, and a drain connected to a sixth control signal; and
   a fifth NMOS transistor having a gate connected to a seventh control signal, a drain connected to each of the main bitlines, and a source connected to the second terminal of the sub bitline.

10. The device of claim 9, wherein the row redundancy cell array includes sub row redundancy cell blocks, wherein each of the sub row redundancy cell blocks has both terminals connected to each of the main bitlines, respectively.

11. The device of claim 10, wherein each of the sub row redundancy cell blocks having the same structure as that of each of the main sub cell blocks includes the same number of unit memory cells as that of each of the main sub cell blocks, and wherein redundancy wordlines and redundancy platelines connected to a predetermined number of the unit memory cells are grounded.

12. The device of claim 10, wherein each of the row redundancy sub cell blocks having the same structure as that of each of the main sub cell blocks includes a smaller number of unit memory cells than that of each of the main sub cell blocks, and wherein each of the row redundancy sub cell blocks further includes a capacitor connected between ground and a sub bitline in the row redundancy sub cell block.

13. The device of claim 12, wherein the capacitor is a NMOS transistor having a gate connected to the sub bitline, a drain and a source connected to ground.

14. The device of claim 12, wherein the capacitor is a NMOS transistor having a gate connected to ground, a drain and a source connected to the sub bitline.

15. The device of claim 12, wherein the capacitor is a diode having an anode connected to ground, and a cathode connected to the sub bitline.

16. The device of claim 12, wherein the capacitor is a ferroelectric memory device.

17. The device of claim 9, wherein the first column redundancy cell array includes first unit cell blocks, each of the first unit cell blocks having the same structure as each of the main sub cell blocks.

18. The device of claim 10, wherein the second column redundancy cell array includes second unit cell blocks, each of the second unit cell blocks having the same structure as each of the sub row redundancy cell blocks.

19. A ferroelectric memory device, comprising:

(1) a main cell array, including:

(A) a main bitline load controller configured to be connected between a main bitline and a positive power, and to control the flow of current in response to a second control signal, and (B) a plurality of main sub cell blocks, each main sub block having both terminals connected to the main bitline, including:

(a) a sub bitline connected in common to a plurality of unit memory cells connected to a wordline and a plateline, (b) a first NMOS transistor having a gate connected to a first terminal of the sub bitline and a drain connected to the main bitline, (c) a second NMOS transistor having a gate connected to a third control signal, a drain connected to a source of the first NMOS transistor, and a source connected to ground, (d) a third NMOS transistor having a gate connected to a fourth control signal, a drain connected to a second terminal of the sub bitline, and a source connected to ground, (e) a fourth NMOS transistor having a gate connected to a fifth control signal, a source connected to the second terminal of the sub bitline, and a drain connected to a sixth control signal, and (f) a fifth NMOS transistor having a gate connected to a seventh control signal, a drain connected to the main bitline, and a source connected to the second terminal of the sub bitline;

(2) a row redundancy cell array configured to share main bitlines with the main cell array;

(3) a first column redundancy cell array configured to share wordlines and platelines with the main cell array and to include redundancy main bitlines;

(4) a second column redundancy cell array configured to share redundancy wordlines and redundancy platelines with the row redundancy cell array, and to share redundancy main bitlines with the column redundancy cell array;

(5) a main bitline pull-up controller for pulling up main bitlines and redundancy main bitlines in response to first control signals, respectively;

(6) a column selection controller for connecting the main bitlines to redundancy columns and the redundancy main bitlines to main columns in response to column selection signals, respectively;

(7) a data bus unit shared by the redundancy column and the main column;

(8) a redundancy bus connected to the data bus unit shared by the redundancy column;

(9) a main bus connected to the data bus unit shared by the main column;

(10) a redundancy sense amplifier array connected to the redundancy bus; and

(11) a main sense amplifier array connected to the main bus.

* * * * *